US009716039B2

(12) United States Patent
Ogawa et al.

(10) Patent No.: US 9,716,039 B2
(45) Date of Patent: Jul. 25, 2017

(54) WAFER PROCESSING METHOD

(71) Applicant: DISCO CORPORATION, Tokyo (JP)

(72) Inventors: Yuki Ogawa, Tokyo (JP); Kensuke Nagaoka, Tokyo (JP); Tsubasa Obata, Tokyo (JP); Yuri Ban, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/151,143

(22) Filed: May 10, 2016

(65) Prior Publication Data

US 2016/0343614 A1   Nov. 24, 2016

(30) Foreign Application Priority Data

May 19, 2015  (JP) ................................ 2015-101599

(51) Int. Cl.
| | |
|---|---|
| *H01L 21/78* | (2006.01) |
| *H01L 21/304* | (2006.01) |
| *H01L 21/683* | (2006.01) |
| *B28D 5/00* | (2006.01) |
| *B28D 5/02* | (2006.01) |

(52) U.S. Cl.
CPC ............... *H01L 21/78* (2013.01); *B28D 5/00* (2013.01); *B28D 5/022* (2013.01); *H01L 21/3043* (2013.01); *H01L 21/6836* (2013.01); *H01L 2221/6834* (2013.01); *H01L 2221/68327* (2013.01)

(58) Field of Classification Search
CPC ....... H01L 2924/00; H01L 2924/00014; H01L 2224/94; H01L 2224/97; H01L 2924/12042
See application file for complete search history.

(56) References Cited

U.S. PATENT DOCUMENTS

2006/0045511 A1 * 3/2006 Genda ..................... H01L 21/78
 396/205
2009/0280622 A1 * 11/2009 Genda ..................... H01L 21/78
 438/462

FOREIGN PATENT DOCUMENTS

JP    2005-064231    3/2005

* cited by examiner

*Primary Examiner* — Jaehwan Oh
(74) *Attorney, Agent, or Firm* — Greer Burns & Crain Ltd.

(57) ABSTRACT

A wafer having a substrate and a functional layer formed on the front side of the substrate is processed by attaching a protective tape curable by an external stimulation to the front side of the functional layer. The substrate is cut from the back side along each division line by using a cutting blade, thereby forming a cut groove having a depth not reaching the functional layer, with a part of the substrate left between the bottom of the cut groove and the functional layer. A laser beam is applied along the cut groove, thereby dividing the remaining part of the substrate to divide the wafer into device chips. When the groove is formed, an uncut portion in which the cut groove is not formed is left in a peripheral marginal area of the wafer.

2 Claims, 12 Drawing Sheets

WAFER PROCESSING METHOD

BACKGROUND OF THE INVENTION

Field of the Invention

The present invention relates to a wafer processing method.

Description of the Related Art

There has been put into practical use a manufacturing method for a semiconductor wafer having a plurality of semiconductor devices such as ICs and LSIs, wherein the semiconductor wafer is intended to improve the processing performance of the semiconductor devices. This semiconductor wafer is composed of a substrate and a functional layer formed on the front side of the substrate, wherein the functional layer is formed by stacking a plurality of low-permittivity insulator films (low-k films). Examples of each low-k film include an inorganic film of SiOF, BSG (SiOB), etc. and an organic film such as a polymer film of polyimide, parylene, etc. The semiconductor devices are formed from the functional layer of the wafer. The functional layer is brittle so that it is easily separated from the substrate in cutting the wafer by using a cutting blade. To cope with this problem, there has been performed a wafer processing method including the steps of applying a laser beam along both sides of each division line on a semiconductor wafer to form two laser processed grooves dividing the functional layer along each division line, and next positioning a cutting blade between the two laser processed grooves along each division line to relatively move the cutting blade and the semiconductor wafer, thereby cutting the wafer along each division line (see Japanese Patent Laid-Open No. 2005-64231, for example).

However, this wafer processing method has the following problems. Since the functional layer is divided in the condition where the spacing between the two laser processed grooves is larger than the width of the cutting blade, laser scanning must be performed plural times along each division line, causing an increase in processing time. Further, uneven wearing of the cutting blade may occur depending upon the shape of the laser processed grooves formed along each division line. Further, a protective film must be formed on the front side of the wafer, so as to prevent the adhesion of debris generated in laser processing. Further, a passivation film of $SiO_2$, SiN, etc. is formed on the front side of the functional layer. Accordingly, when a laser beam is applied to the wafer from the front side thereof, the laser beam passes through the passivation film to reach the inside of the functional layer, causing passable damage to the devices.

To cope with these problems, the prevent applicant has proposed a processing method for a wafer including a substrate and a functional layer formed on the front side of the substrate, wherein the substrate of the wafer is cut from the back side thereof along each division line by using a cutting blade to form a cut groove having a depth not reaching the functional layer with a part of the substrate left between the bottom of the cut groove and the functional layer, and the functional layer is next removed by applying a laser beam to the bottom of the cut groove or by performing plasma etching.

SUMMARY OF THE INVENTION

However, this processing method yet has the following problems. That is, the substrate of the wafer is first cut over most of the thickness of the substrate by the cutting blade. Thereafter, the wafer is transferred to a laser processing apparatus to divide the wafer. Accordingly, there is a possibility of damage to the wafer in transferring. Further, in applying the laser beam to the bottom of the cut groove, the bottom of the cut groove is imaged. However, it is hard to see the mark of the laser beam applied to the bottom of the cut groove. Accordingly, even when the applying position of the laser beam is deviated, it is difficult to find the deviation in the applying position of the laser beam, causing difficulty in correcting the applying position of the laser beam.

It is therefore an object of the present invention to provide a wafer processing method which can suppress damage to the wafer in transferring and can easily correct the applying position of the laser beam.

In accordance with an aspect of the present invention, there is provided a wafer processing method for processing a wafer including a substrate and a functional layer formed on a front side of the substrate, the functional layer being formed with a plurality of crossing division lines and a plurality of devices individually formed in a plurality of separate regions defined by the crossing division lines, the wafer having a device area where the devices are formed and a peripheral marginal area surrounding the device area. The wafer processing method includes a protective tape attaching step, a cut groove forming step, and a dividing step. The protective tape attaching step is the step of attaching a protective tape curable by an external stimulation to a front side of the functional layer. The cut groove forming step is the step of cutting the substrate from a back side thereof along each division line by using a cutting blade after performing the protective tape attaching step, thereby forming a cut groove having a depth not reaching the functional layer with a part of the substrate left between a bottom of the cut groove and the functional layer. The dividing step is the step of applying a laser beam having an absorption wavelength to the substrate along the cut groove after performing the cut groove forming step, thereby dividing the part of the substrate left between the bottom of the cut groove and the functional layer to divide the wafer into a plurality of device chips. In the cut groove forming step, an uncut portion in which the cut groove is not formed is left in the peripheral marginal area of the wafer.

Preferably, the laser beam is applied to an area of the wafer corresponding to each division line and including the uncut portion in the dividing step, thereby forming a laser processed groove on an upper surface of the uncut portion. The dividing step includes a deviation detecting step of imaging the laser processed groove formed on the upper surface of the uncut portion by using imaging means to detect a deviation between a desired laser beam applying position and a position of the laser processed groove as processing position correction information, and a position correcting step of correcting the applying position of the laser beam according to the processing position correction information after performing the deviation detecting step.

According to the wafer processing method of the present invention, the uncut portion is formed in the peripheral marginal area of the wafer in the cut groove forming step. That is, the uncut portion functions as a reinforcing portion formed along the outer circumference of the wafer, so that it is possible to suppress damage to the wafer in transferring. Further, the laser beam is applied also to the uncut portion in the dividing step, so that the applying position of the laser beam can be clearly recognized on the flat upper surface of the uncut portion. Accordingly, the applying position of the laser beam can be easily corrected.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to the preferred embodiment. Further, the components used in the preferred embodiment may include those that can be easily assumed by persons skilled in the art or substantially the elements as those known in the art. Further, the configurations described below may be suitably combined. Further, the configurations may be variously omitted, replaced, or changed without departing from the scope of the present invention.

Figure 1:
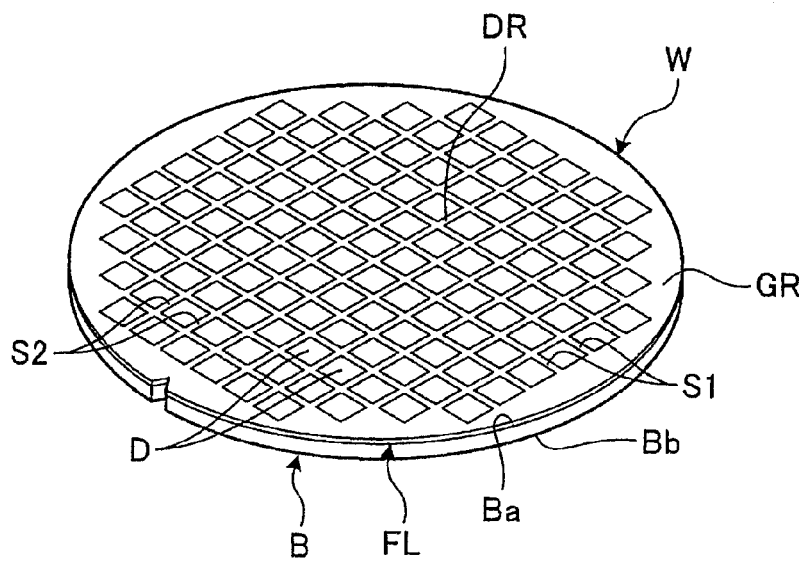
FIG. 1 is a perspective view of a wafer as a workpiece to be processed by a wafer processing method according to a preferred embodiment of the present invention.
Figure 2:
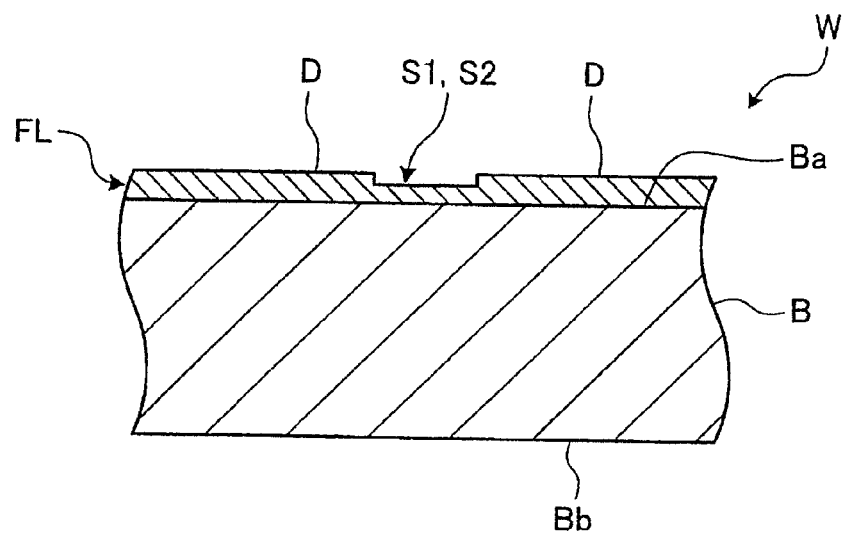
FIG. 2 is an enlarged sectional view of an essential part of the wafer shown in FIG. 1.
Figure 8A:
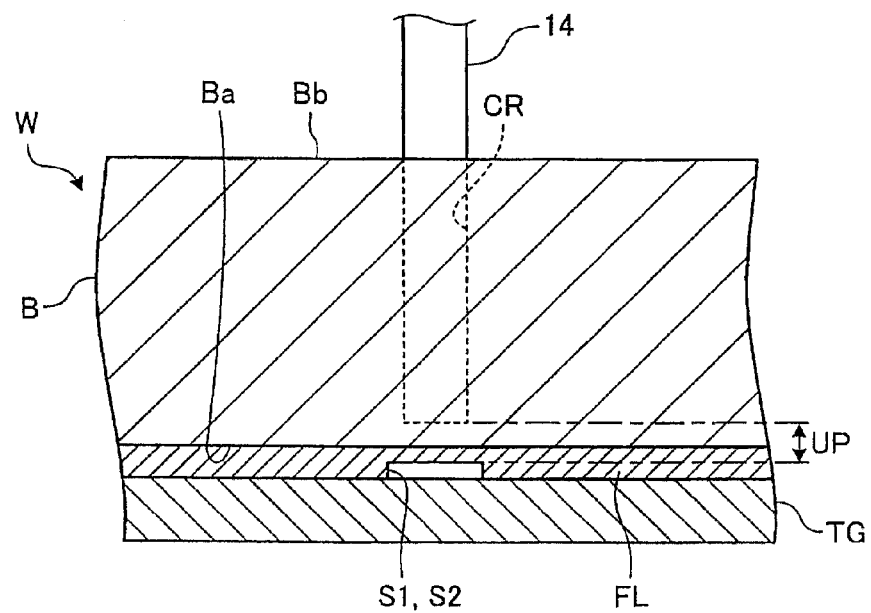
FIG. 8A is an enlarged sectional view taken along the line VIIIA-VIIIA in FIG. 7A.
Figure 8B:
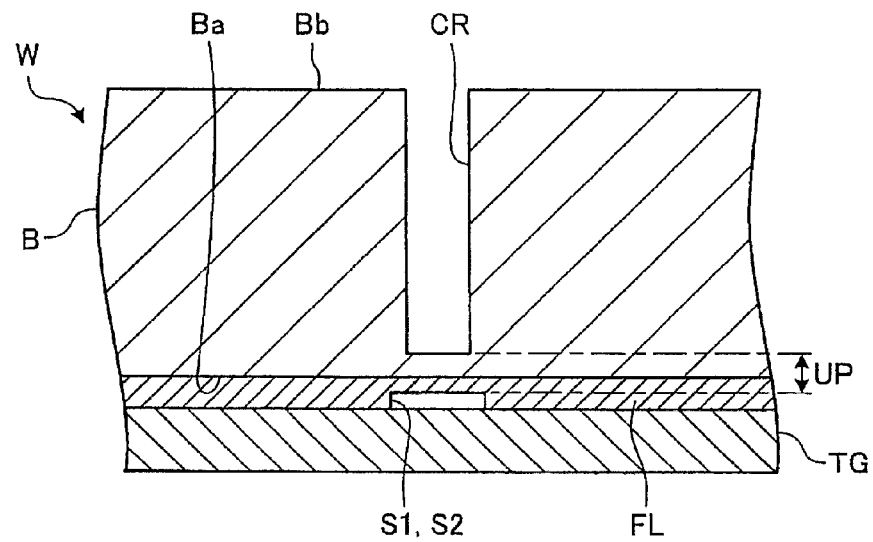
FIG. 8B is an enlarged sectional view taken along the line VIIIB-VIIIB in FIG. 7B.
Figure 13:
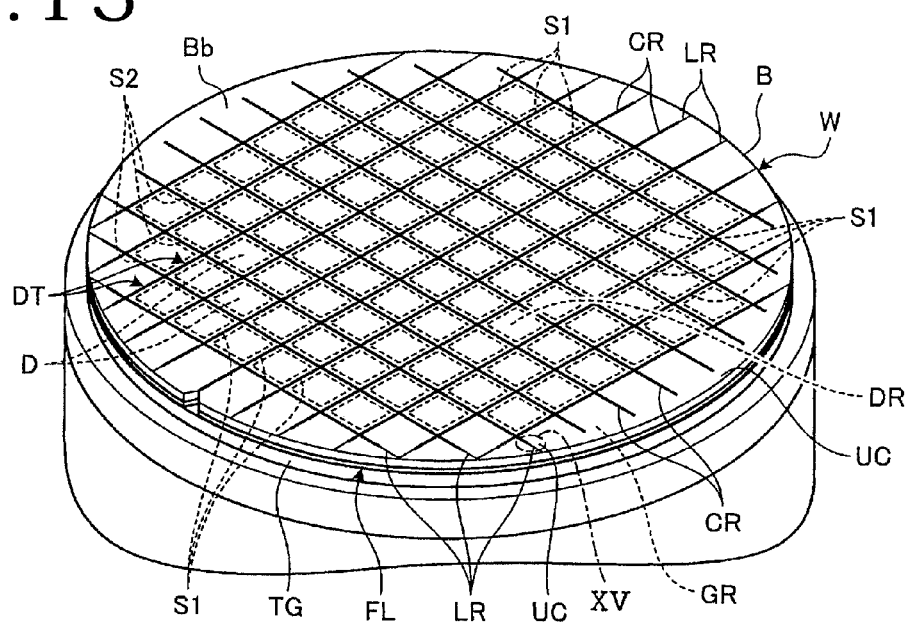

The wafer processing method (which will be hereinafter referred to simply as processing method) according to the preferred embodiment is a method of processing a wafer W shown in FIGS. 1 and 2. More specifically, the processing method according to the preferred embodiment is a method including the steps of forming a cut groove CR (see FIGS. 8A and 8B) on a back side Bb of a substrate B of the wafer W having a functional layer FL on a front side Ba of the substrate B and next applying a laser beam L (see FIG. 10) to the bottom of the cut groove CR to thereby divide the wafer W into a plurality of individual device chips DT (see FIG. 13). As shown in FIGS. 1 and 2, the wafer W as a workpiece to be divided into the individual device chips DT by the processing method according to the preferred embodiment includes the substrate B and the functional layer FL formed on the front side Ba of the substrate B. The substrate B is a disk-shaped semiconductor wafer or optical device wafer formed of silicon, sapphire, or gallium arsenide, for example. The substrate B has a thickness of 50 µm to 300 µm. The functional layer FL is formed by alternately stacking a plurality of insulating films and a plurality of functional films forming circuits. A plurality of crossing division lines S1 and S2 are formed on the front side (upper surface as viewed in FIG. 2) of the functional layer FL of the wafer W to thereby define a plurality of separate regions where a plurality of devices D constituting the device chips DT such as ICs and LSIs are individually formed. That is, the device chips DT include the devices D.

The division lines S1 and S2 are composed of the plural division lines S1 parallel to each other and the plural division lines S2 perpendicular to the division lines S1. Further, the wafer W has a device area DR where the devices D are formed and a peripheral marginal area GR surrounding the device area DR. That is, the devices D are not formed in the peripheral marginal area GR.

In the preferred embodiment, the insulating films constituting the functional layer FL are $SiO_2$ films or low-permittivity insulator films (low-k films). Examples of each low-k film include an inorganic film of SiOF, BSG (SiOB), etc. and an organic film such as a polymer film of polyimide, parylene, etc. The thickness of the functional layer FL is set to 10 µm. A passivation film of $SiO_2$, SiN, etc. is formed on the front side of the functional layer FL. As shown in FIG. 2, the front side of the functional layer FL in an area forming the division lines S1 and S2 is slightly lower in level than the front side of the functional layer FL in an area forming the devices D.

Figure 16:
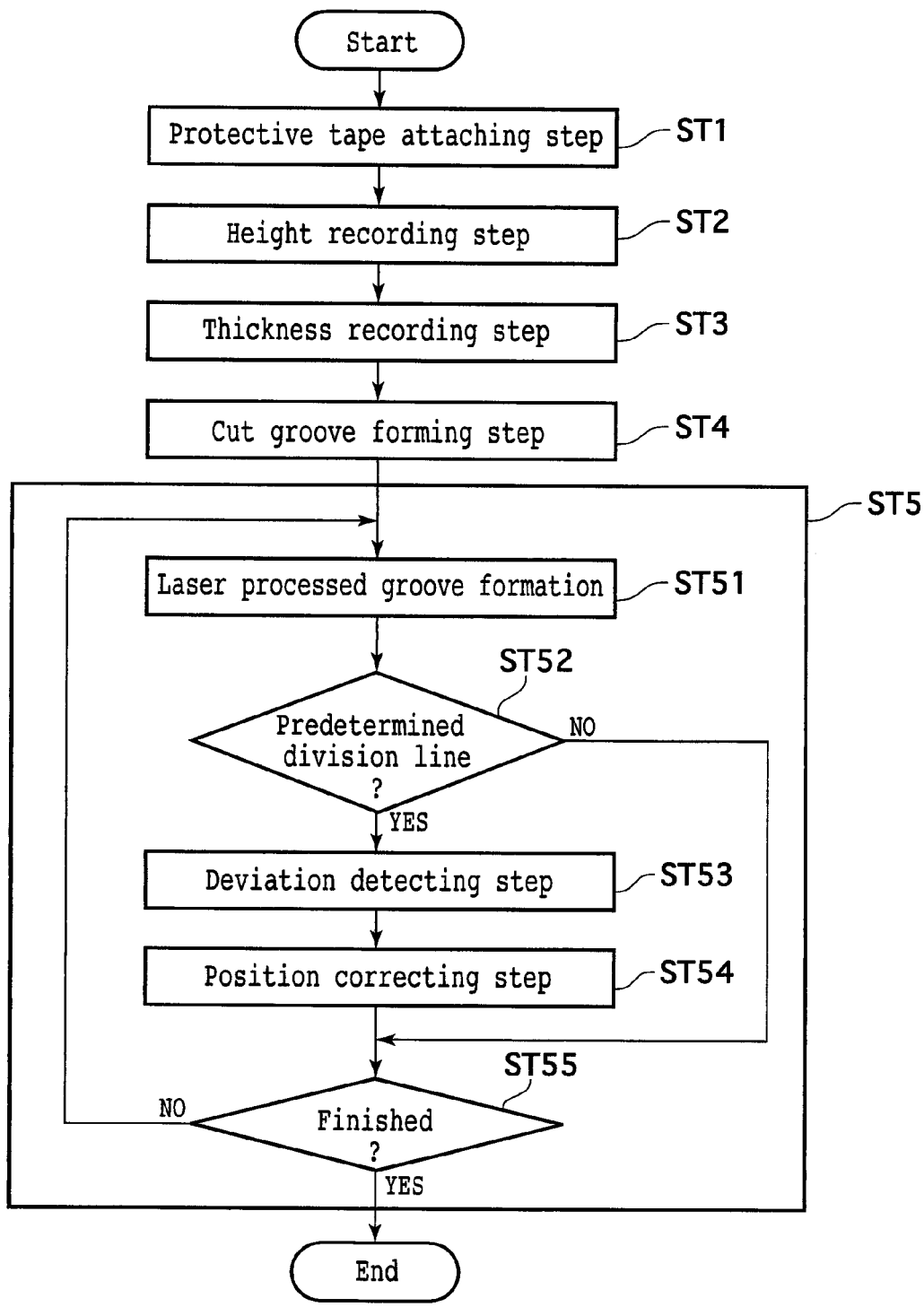
FIG. 16 is a flowchart showing the wafer processing method according to the preferred embodiment.

The processing method according to the preferred embodiment is a processing method for dividing the wafer W along the division lines S1 and S2. As shown in FIG. 16, this processing method includes a protective tape attaching step ST1, a height recording step ST2, a thickness recording step ST3, a cut groove forming step ST4, and a dividing step ST5.

Figure 3A:
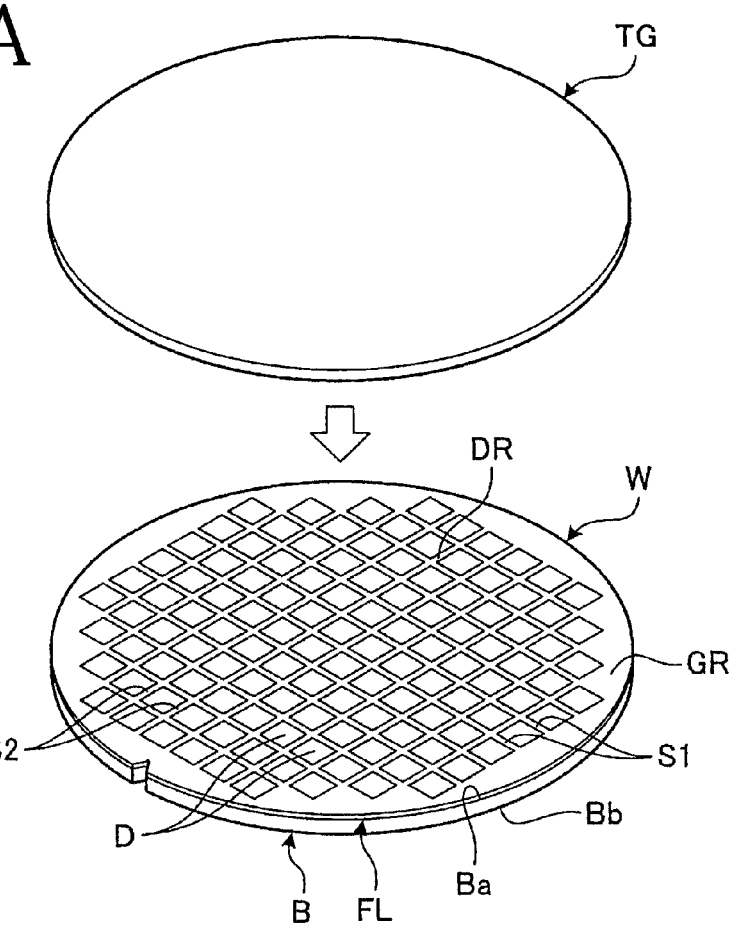
FIGS. 3A and 3B are perspective views showing a protective tape attaching step.
Figure 3B:
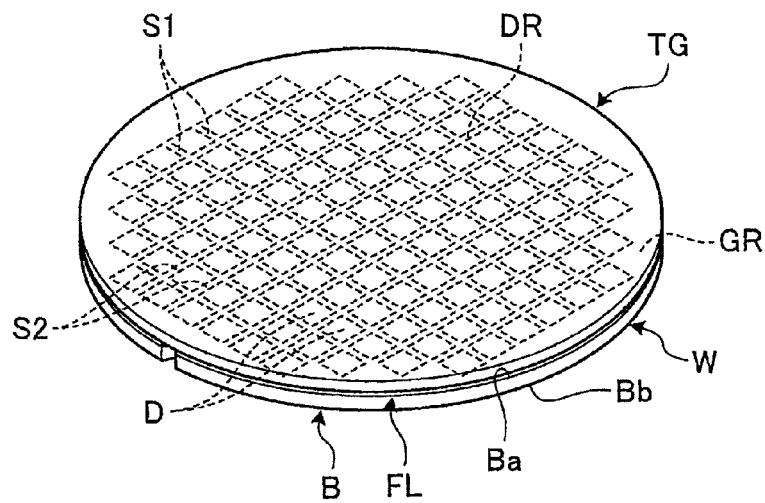

First, the protective tape attaching step ST1 is performed as shown in FIGS. 3A and 3B. In this protective tape attaching step ST1, a protective tape TG having an adhesive layer curable by an external stimulus is opposed to the front side of the functional layer FL constituting the wafer W as shown in FIG. 3A. Thereafter, the protective tape TG is attached through its adhesive layer to the front side of the functional layer FL to protect the devices D as shown in FIG. 3B. The protective tape TG is composed of a base sheet such as a resin sheet (e.g., polyethylene film) and the adhesive layer formed on the front side of the base sheet. This adhesive layer is curable by any external stimulus such as application of ultraviolet radiation or heating. After performing the protective tape attaching step ST1, the height recording step ST2 is performed.

Figure 4:
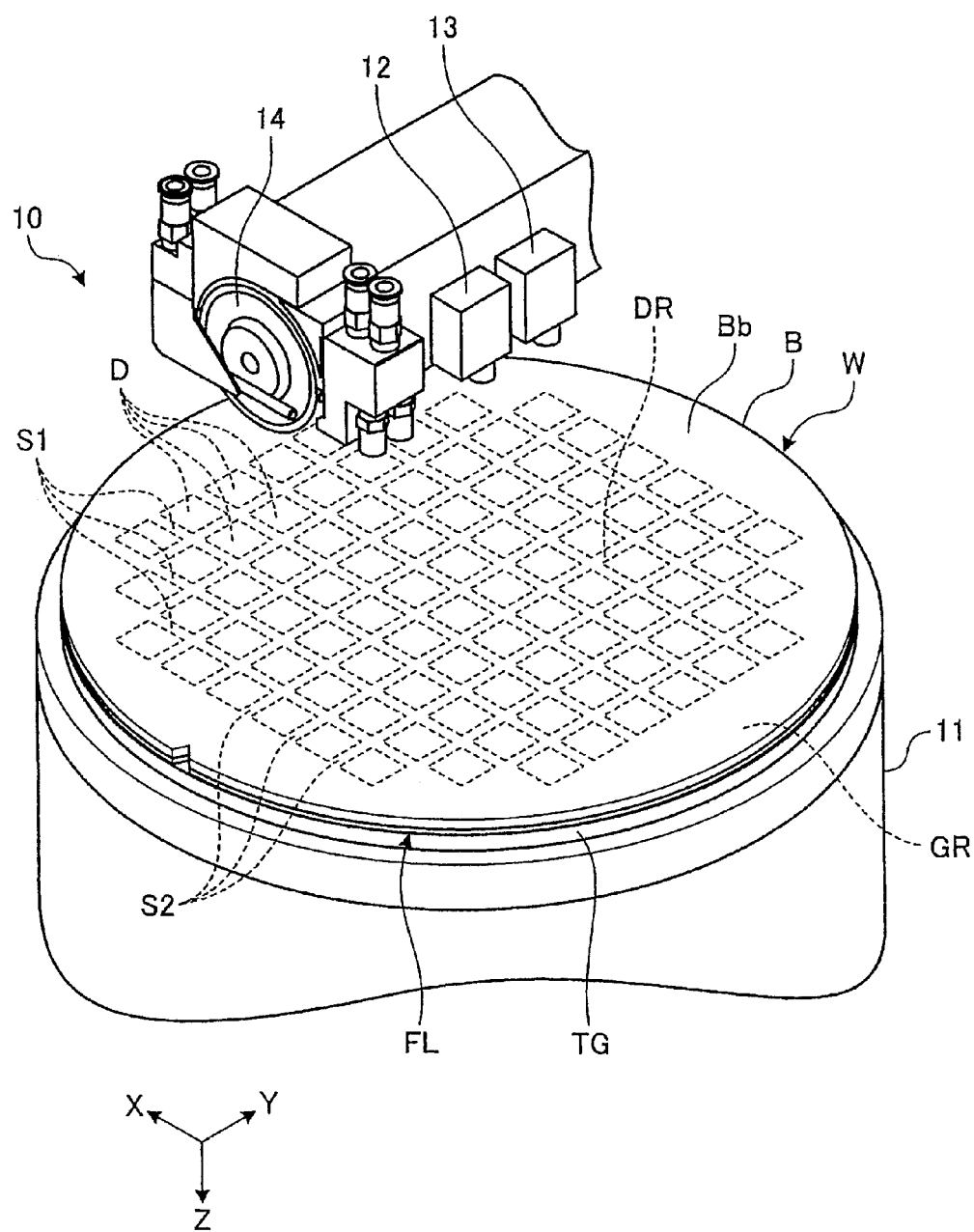
FIG. 4 is a perspective view showing a condition that the wafer is held on a chuck table of a cutting apparatus after performing the protective tape attaching step.

In the height recording step ST2, the wafer W is placed on a holding surface (upper surface) of a chuck table 11 constituting a cutting apparatus 10 shown in FIG. 4 in the condition where the protective tape TG attached to the wafer W is in contact with the holding surface of the chuck table 11. Thereafter, a vacuum is applied from a vacuum source (not shown) through a suction passage (not shown) to the holding surface of the chuck table 11, thereby holding the wafer W through the protective tape TG on the holding surface of the chuck table 11 under suction.

Figure 5A:
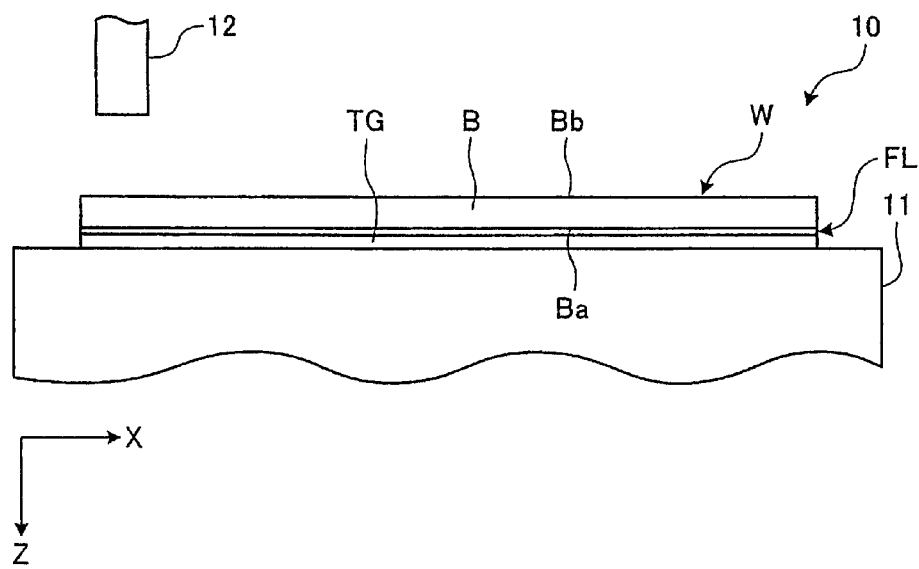
FIGS. 5A and 5B are side views showing a height recording step.
Figure 5B:
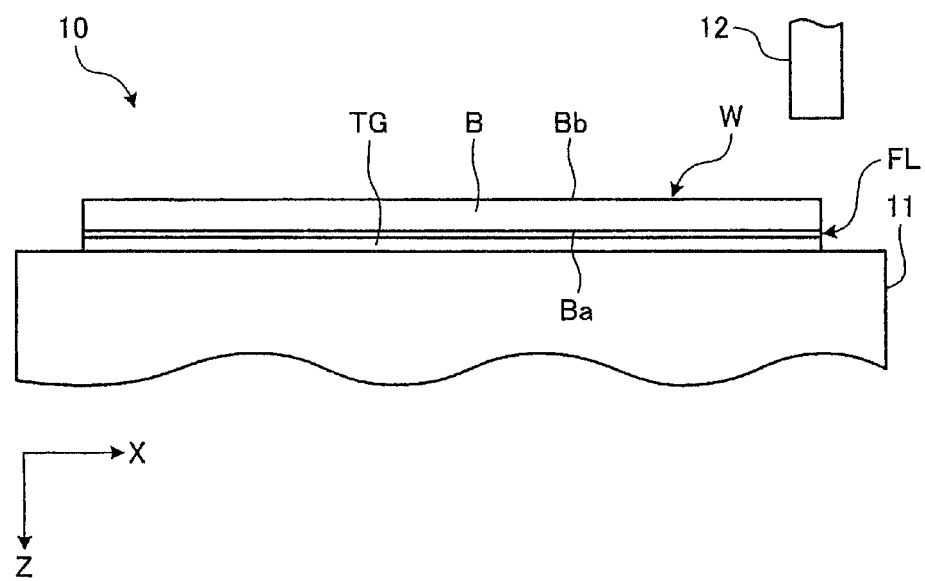

Thereafter, as shown in FIG. 5A, one end of a predetermined one of the division lines S1 and S2 of the wafer W is positioned directly below height measuring means 12 included in the cutting apparatus 10 shown in FIG. 4. Thereafter, the height measuring means 12 is operated and feeding means (not shown) included in the cutting apparatus 10 is also operated to move the chuck table 11 in the X direction where the predetermined division line S1 or S2 extends. When the other end of the predetermined division line S1 or S2 reaches the position directly below the height measuring means 12 as shown in FIG. 5B, the operation of the feeding means is stopped and the operation of the height measuring means 12 is also stopped. Accordingly, the height measuring means 12 detects the height of the back side Bb of the substrate B in the area corresponding to the predetermined division line S1 or S2 of the wafer W held on the chuck table 11. The height measuring means 12 may be designed to apply a laser beam to the back side Bb of the substrate B, thereby measuring the height of the back side Bb. Other examples of the height measuring means 12 include a laser displacement gauge, back pressure sensor, and microgauge. After performing the height recording step ST2, the thickness recording step ST3 is performed.

Figure 6A:
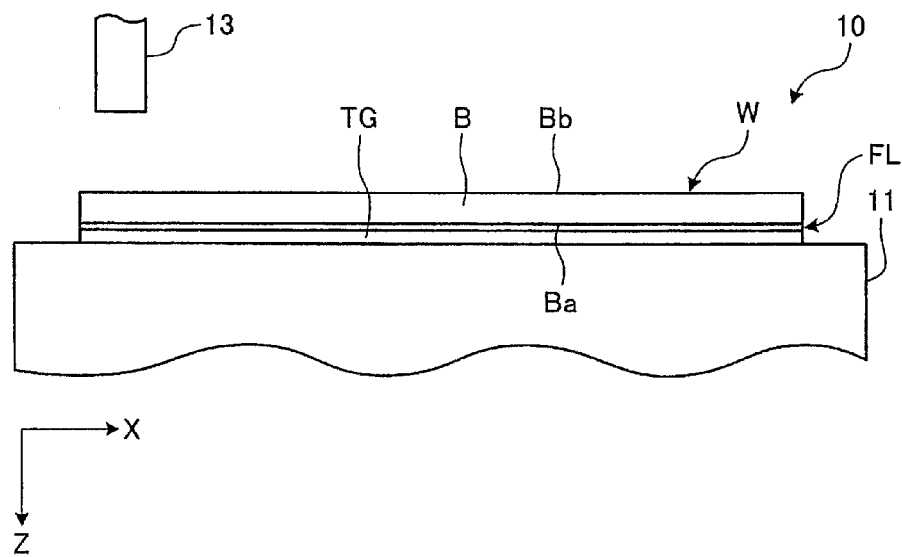
FIGS. 6A and 6B are side views showing a thickness recording step.
Figure 6B:
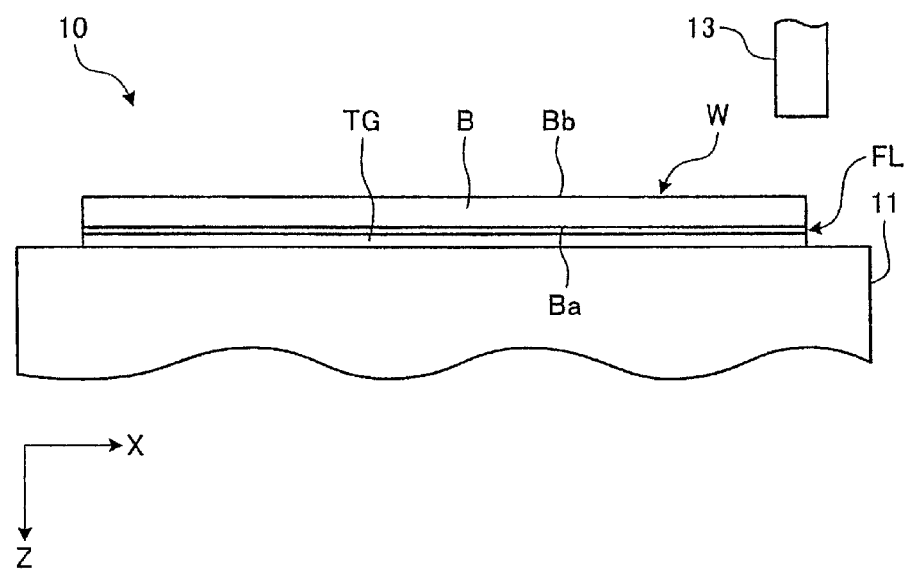

In the thickness recording step ST3, as shown in FIG. 6A, one end of the predetermined division line S1 or S2 of the wafer W is positioned directly below thickness measuring means 13 included in the cutting apparatus 10 shown in FIG. 4. Thereafter, the thickness measuring means 13 is operated and the feeding means (not shown) included in the cutting apparatus 10 is also operated to move the chuck table 11 in the X direction where the predetermined division line S1 or S2 extends. When the other end of the predetermined division line S1 or S2 reaches the position directly below the thickness measuring means 13 as shown in FIG. 6B, the operation of the feeding means is stopped and the operation of the thickness measuring means 13 is also stopped. Accordingly, the thickness measuring means 13 detects the thickness in the area corresponding to the predetermined division line S1 or S2 of the wafer W held on the chuck table 11. The thickness to be detected may be selected from the thickness of the wafer W, the thickness of the substrate B, and the thickness of the functional layer FL. The thickness measuring means 13 may be designed to apply ultrasonic radiation to the back side Bb of the substrate B, thereby measuring the thickness. Other examples of the thickness measuring means 13 include an ultrasonic thickness gauge and a laser interferometer. After performing the thickness recording step ST3, the cut groove forming step ST4 is performed as shown in FIGS. 7A and 7B and FIGS. 8A and 8B.

In the cut groove forming step ST4, a cutting blade 14 included in the cutting apparatus 10 shown in FIG. 4 is used to cut the substrate B of the wafer W held on the chuck table 11 from the back side Bb of the substrate B along the division lines S1 and S2, thereby forming a cut groove CR in the area corresponding to each of the division lines S1 and S2, the cut groove CR having a depth not reaching the functional layer FL with a remaining part UP (see FIGS. 8A and 8B) left between the bottom of the cut groove CR and the front side of the functional layer FL. Further, in the cut groove forming step ST4, the cut groove CR is not formed in the peripheral marginal area GR of the wafer W, thereby forming an uncut portion UC (see FIG. 7B) in the peripheral marginal area GR. In the cut groove forming step ST4, alignment is performed according to an image obtained by imaging means (not shown) included in the cutting apparatus 10. This alignment is performed by performing image processing such as pattern matching between the area of the back side Bb of the substrate B corresponding to the predetermined division line S1 or S2 and the cutting blade 14 (see FIG. 4).

Figure 7A:
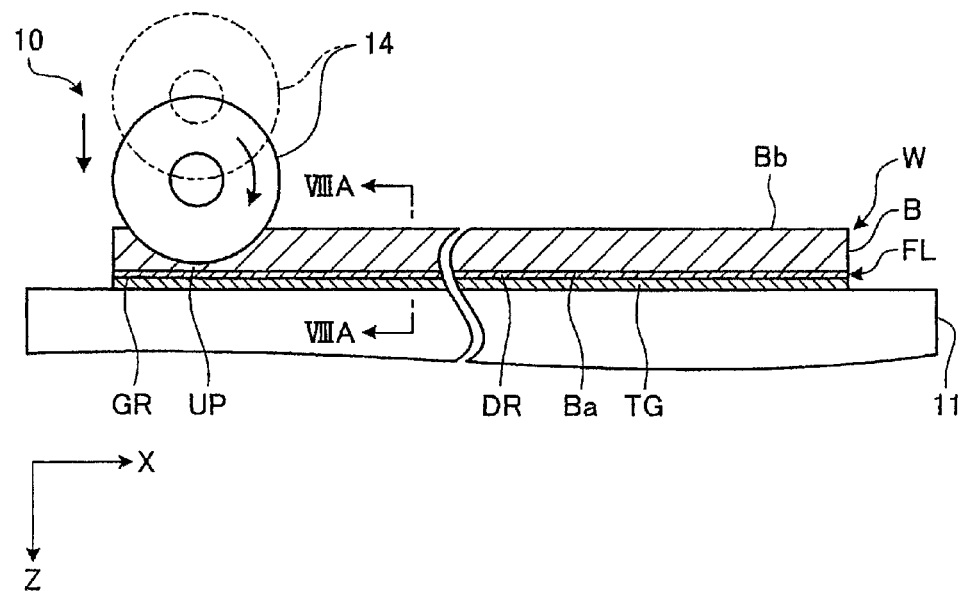
FIGS. 7A and 7B are sectional views showing a cut groove forming step.

Thereafter, the cutting blade 14 is positioned in the area of the back side Bb of the substrate B corresponding to the predetermined division line S1 or S2 to form the cut groove CR in this area with the part UP left between the bottom of the cut groove CR and the front side of the functional layer FL as shown in FIGS. 7A and 7B and FIGS. 8A and 8B. More specifically, as shown by a phantom line in FIG. 7A, the cutting blade 14 is positioned directly above the outer edge of the device area DR slightly radially inside of one end of the predetermined division line S1 or S2. Thereafter, the height of the front side of the functional layer FL in the area corresponding to the predetermined division line S1 or S2 is calculated according to the height of the back side Bb measured in the height recording step ST2 and the thickness measured in the thickness recording step ST3, in order to form the remaining part UP having a thickness of about 10 µm as measured from the front side (lower surface as viewed in FIG. 8B) of the functional layer FL in this area. Thereafter, as shown in FIG. 7A, the cutting blade 14 is lowered to cut into the wafer W so that the outer circumference of the cutting blade 14 does not reach the functional layer FL.

Figure 7B:
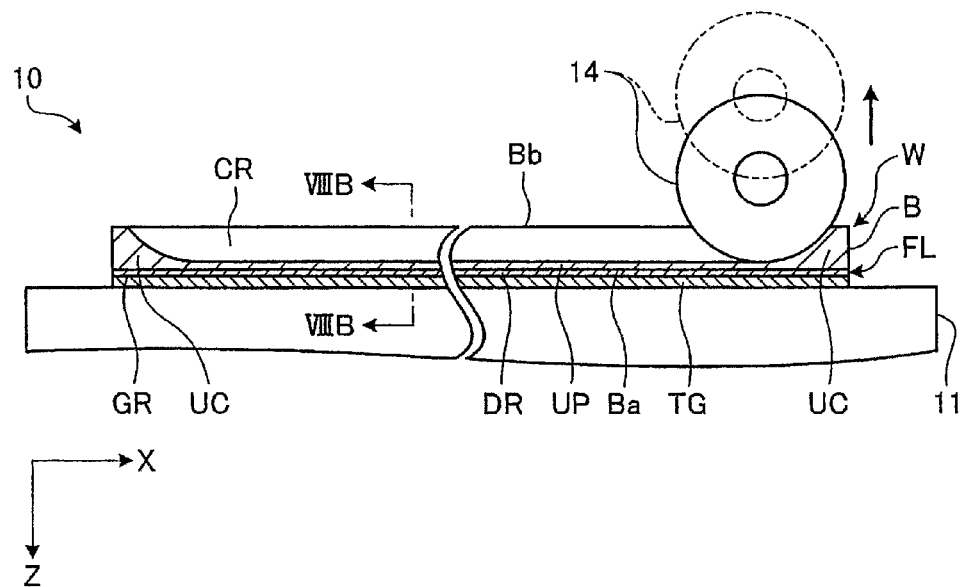

Thereafter, the chuck table 11 is moved in the X direction to relatively move the cutting blade 14 toward the other end of the predetermined division line S1 or S2. When the cutting blade 14 reaches the outer edge of the device area DR slightly radially inside of the other end of the predetermined division line S1 or S2 as shown in FIG. 7B, the movement of the chuck table 11 is stopped and the cutting blade 14 is raised to the position shown by a phantom line in FIG. 7B. Accordingly, the cut groove CR is formed on the back side Bb of the substrate B along the predetermined division line S1 or S2 in the condition where the uncut portion UC (see FIG. 9) is left in the peripheral marginal area GR of the wafer W in the cut groove forming step ST4. The cut groove CR is similarly formed along all of the other division lines S1 and S2 to thereby form the uncut portion UC along the whole of the outer circumference of the wafer W, wherein the cut grooves CR are not formed in the uncut portion UC. After performing the cut groove forming step ST4 along all of the division lines S1 and S2, the dividing step ST5 is performed.

Figure 9:
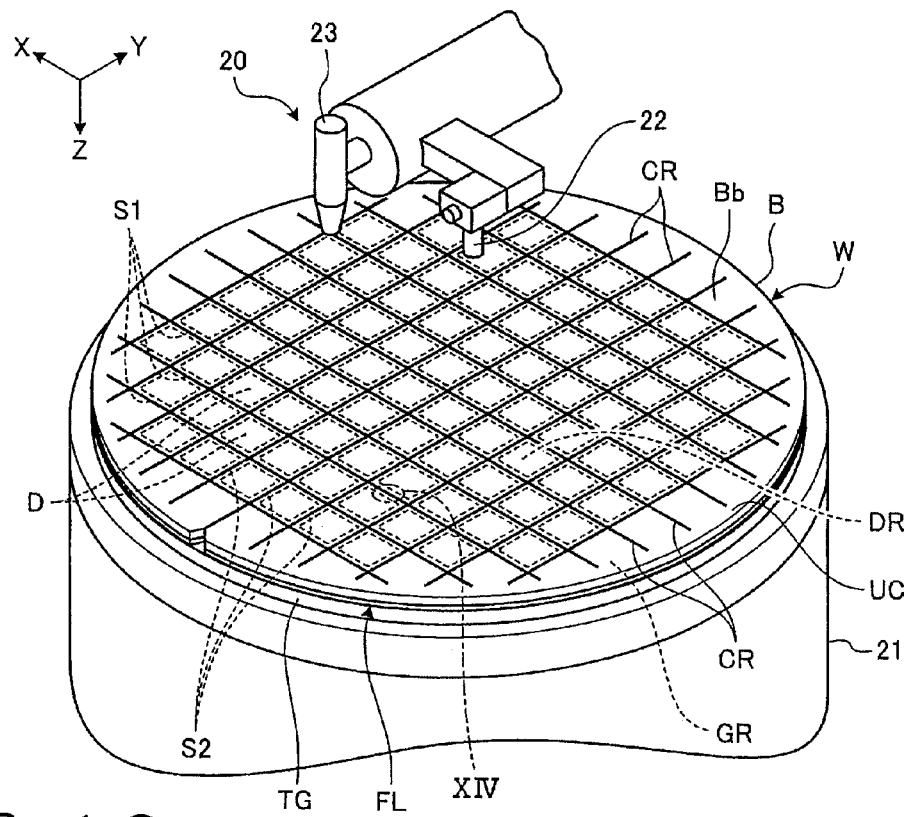
FIG. 9 is a perspective view showing a condition that the wafer is held on a chuck table of a laser processing apparatus after performing the cut groove forming step.

The dividing step ST5 is the step of dividing the remaining part UP extending along each division line S1 or S2 to thereby divide the wafer W into the device chips DT. As shown in FIG. 9, the dividing step ST5 is performed by using a laser processing apparatus 20 including a chuck table 21, imaging means 22, and laser beam applying means 23. First, the wafer W is placed on a porous holding surface (upper surface) of the chuck table 21 in the condition where the protective tape TG attached to the wafer W is in contact with the holding surface. Thereafter, a vacuum is applied from a vacuum source (not shown) through a suction passage (not shown) to the holding surface of the chuck table 21, thereby holding the wafer W through the protective tape TG on the holding surface of the chuck table 21 under suction.

Figure 10:
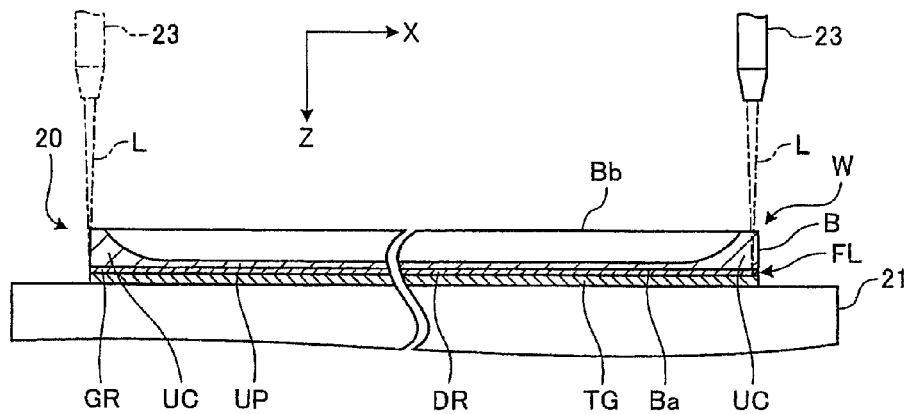
FIG. 10 is a sectional view showing a dividing step.
Figure 11A:
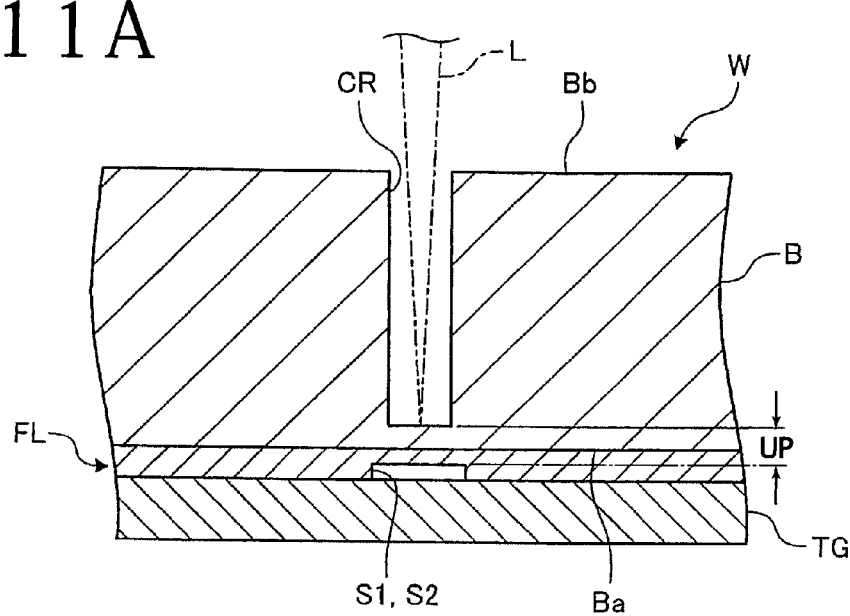
FIGS. 11A and 11B are enlarged sectional views of essential parts of the wafer in the dividing step.
Figure 11B:
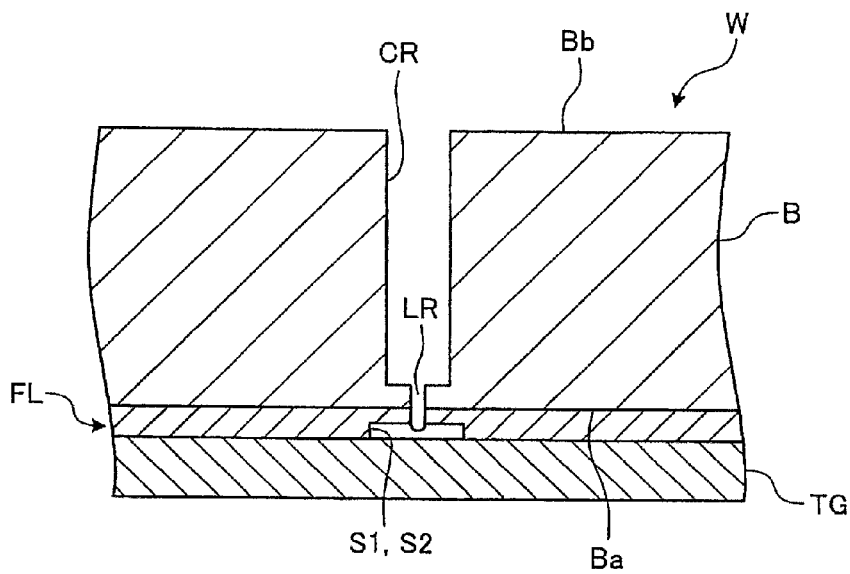
Figure 12:
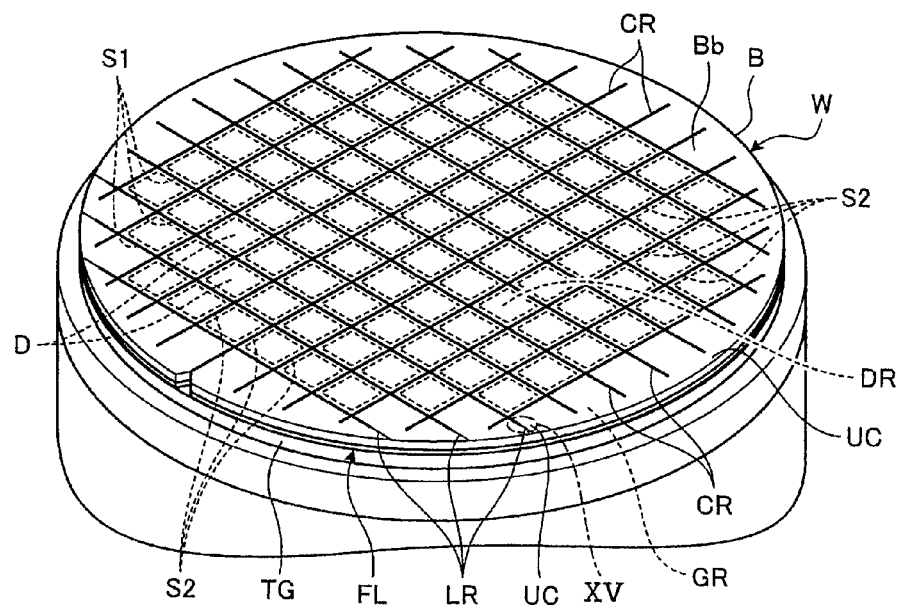
FIGS. 12 and 13 are perspective views showing the formation of laser processed grooves along crossing division lines of the wafer in the dividing step.
Figure 14:
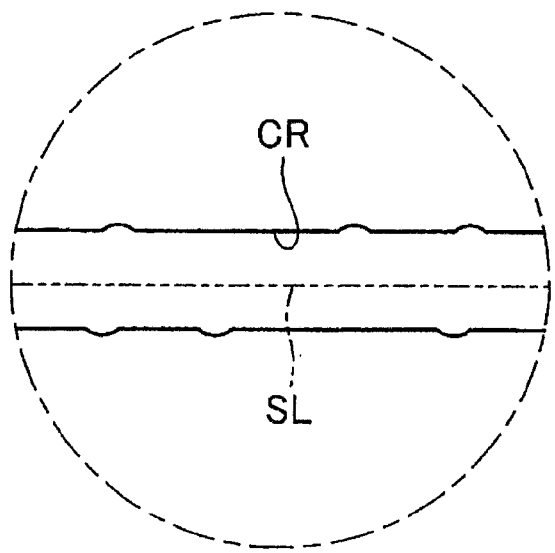
FIG. 14 is a plan view showing an image obtained by using imaging means of the laser processing apparatus to image a portion XIV shown in FIG. 9.

Thereafter, alignment is performed according to an image (see FIG. 14) obtained by the imaging means 22. Thereafter, moving means (not shown) is operated to relatively move the laser beam applying means 23 along the division lines S1 and S2 of the wafer W held on the chuck table 21. At the same time, a laser beam L having an absorption wavelength (e.g., 355 nm) to the substrate B of the wafer W is applied from the laser beam applying means 23 to the wafer W along each cut groove CR as shown in FIGS. 10 and 11A. In the preferred embodiment, the laser beam L is applied along the entire length of each of the division lines S1 and S2 in the condition where the focal point of the laser beam L is set on the upper surface of each remaining part UP (i.e., the bottom of each cut groove CR), thereby performing ablation in each remaining part UP along the entire length of each division line S1 or S2. That is, a laser processed groove LR is formed along the entire length of each division line S1 or S2 as shown in FIG. 11B (step ST51). In this manner, the dividing step ST5 includes the step of applying the laser beam L along the entire length of each division line S1 or S2 in the area including the uncut portion UC, thereby also forming the laser processed groove LR on the upper surface of the uncut portion UC (i.e., on the back side Bb of the substrate B in the uncut portion UC).

Figure 15:
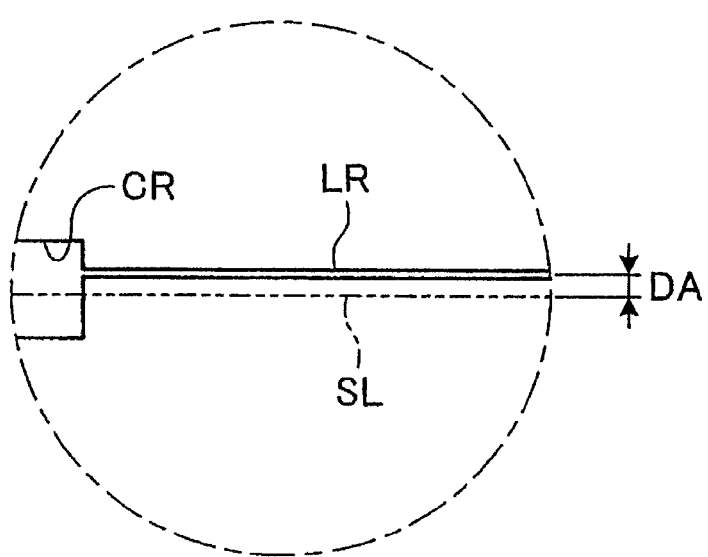
FIG. 15 is a plan view showing an image obtained by using the imaging means of the laser processing apparatus to image a portion XV shown in FIGS. 12 and 13.

More specifically, the dividing step ST5 is performed in the following manner. First, the laser beam applying means 23 is relatively moved in the X direction along the plural division lines S1 of the wafer W held on the chuck table 21 to thereby form the laser processed groove LR along each division line S1 (step ST51). Thereafter, control means (not shown) included in the laser processing apparatus 20 determines whether or not the laser beam L has been applied along a predetermined one of the plural division lines S1 (step ST52). When the control means determines that the laser beam L has been applied along the predetermined division line S1 (step ST52: Yes), the laser processed groove LR formed in the uncut portion UC is imaged by the imaging means 22 to obtain an image shown in FIG. 15. Thereafter, the control means performs a deviation detecting step of detecting a deviation DA in position between the laser processed groove LR and a predetermined reference line SL in the image shown in FIG. 15 (e.g., a laterally central line in the cut groove CR shown by a phantom line in FIG. 15, which line corresponds to a desired laser beam applying position), wherein the deviation DA is detected as processing position correction information (step ST53). The predetermined division line S1 in step ST52 may be provided by the division line S1 counted by several lines from the first division line S1 where the processing is started.

In performing the processing for the subsequent division lines S1 after the predetermined division line S1, the control means performs a position correcting step of correcting the applying position of the laser beam L according to the processing position correction information as the deviation DA detected above (step ST54). More specifically, the control means corrects the relative position between the laser beam applying means 23 and the wafer W according to the deviation DA detected above so that the laser processed groove LR is formed on the reference line SL. When the control means determines that the laser beam L has not been applied to the predetermined division line S1 (step ST52: No) or after performing the position correcting step ST54, the control means determines whether or not the laser processed groove LR has been formed along all of the division lines S1 and S2 (step ST55). Since the control means determines that the laser processed groove LR has not yet been formed along all of the division lines S1 and S2 (step ST55: No), the program returns to step ST51.

When the laser processed groove LR is formed along all of the division lines S1, the chuck table 21 is rotated 90 degrees to make the division lines S2 parallel to the X direction. Thereafter, the laser beam applying means 23 is relatively moved in the X direction along the division lines S2 and the laser beam L is applied to the wafer W along each division line S2 (step ST51). Thereafter, the control means determines whether or not the laser beam L has been applied along a predetermined one of the plural division lines S2 (step ST52). When the control means determines that the laser beam L has been applied along the predetermined division line S2 (step ST52: Yes), the laser processed groove LR formed in the uncut portion UC is imaged by the imaging means 22 to obtain the image shown in FIG. 15. Thereafter, the control means performs the deviation detecting step of detecting the deviation DA from the image shown in FIG. 15 (step ST53). The predetermined division line S2 in step ST52 may be provided by the division line S2 counted by several lines from the division line S2 where the processing is started after 90 degrees rotating the wafer W.

Thereafter, the control means performs the position correcting step of correcting the applying position of the laser beam L according to the processing position correction information as the deviation DA detected above (step ST54). When the control means determines that the laser beam L has not yet been applied to the predetermined division line S2 (step ST52: No) or after performing the position correcting step ST54, the control means determines whether or not the laser processed groove LR has been formed along all of the division lines S1 and S2 (step ST55). When the control means determines that the laser processed groove LR has not yet been formed along all of the division lines S1 and S2 (step ST55: No), the program returns to step ST51, whereas when the control means determines that the laser processed groove LR has been formed along all of the division lines S1 and S2 (step ST55: Yes), the suction holding of the wafer W on the chuck table 21 is canceled to end the processing method.

In the processing method according to the preferred embodiment, the uncut portion UC is formed in the peripheral marginal area GR of the wafer W in the cut groove forming step ST4. That is, the uncut portion UC functions as a reinforcing portion formed along the outer circumference of the wafer W. Accordingly, although the cut grooves CR are formed along the division lines S1 and S2 of the wafer W, it is possible to suppress the breakage of the wafer W in transferring the wafer W from the cutting apparatus 10 to the laser processing apparatus 20. Further, in forming the laser processed groove LR in the dividing step ST5 (step ST51), the laser beam L is applied also to the uncut portion UC, so that the applying position of the laser beam L can be clearly recognized on the flat upper surface of the uncut portion UC. Accordingly, the deviation DA of the applying position of the laser beam L can be detected. Further, by using the deviation DA as a correction value, the laser beam L can be applied to a desired position. Thusly, according to the processing method described above, damage to the wafer W in transferring can be suppressed and the applying position of the laser beam L can also be easily corrected.

The present invention is not limited to the above preferred embodiment, but various modifications may be made without departing from the scope of the present invention. For example, while the control means of the laser processing apparatus 20 corrects the applying position of the laser beam L according to the deviation DA in the above preferred embodiment, an operator of the laser processing apparatus 20 may visually observe the image obtained by the imaging means 22, read the deviation DA, and correct the applying position of the laser beam L.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer including a substrate and a functional layer formed on a front side of said substrate, said functional layer being formed with a plurality of crossing division lines and a plurality of devices individually formed in a plurality of separate regions defined by said crossing division lines, said wafer having a device area where said devices are formed and a peripheral marginal area surrounding said device area, said wafer processing method comprising:
   a protective tape attaching step of attaching a protective tape curable by an external stimulation to a front side of said functional layer;
   a cut groove forming step of cutting said substrate from a back side thereof along each division line by using a cutting blade after performing said protective tape attaching step, thereby forming a cut groove having a depth not reaching said functional layer with a part of said substrate left between a bottom of said cut groove and said functional layer; and
   a dividing step of applying a laser beam having an absorption wavelength to said substrate along said cut groove after performing said cut groove forming step, thereby dividing said part of said substrate left between the bottom of said cut groove and said functional layer to divide said wafer into a plurality of device chips;
   wherein in said cut groove forming step, an uncut portion in which said cut groove is not formed is left in said peripheral marginal area of said wafer.

2. The wafer processing method according to claim 1, wherein said laser beam is applied to an area of said wafer corresponding to each division line and including said uncut portion in said dividing step, thereby forming a laser processed groove on an upper surface of said uncut portion, said dividing step including:
   a deviation detecting step of imaging said laser processed groove formed on the upper surface of said uncut portion by using imaging means to detect a deviation between a desired laser beam applying position and a position of said laser processed groove as processing position correction information; and
   a position correcting step of correcting the applying position of said laser beam according to said processing position correction information after performing said deviation detecting step.

* * * * *